(12) United States Patent
Shen et al.

(10) Patent No.: US 6,633,158 B1
(45) Date of Patent: Oct. 14, 2003

(54) MICRO MAGNETIC PROXIMITY SENSOR APPARATUS AND SENSING METHOD

(76) Inventors: Jun Shen, 14654 S. 25th Pl., Phoenix, AZ (US) 85048; Chengping Wei, 522 E. Jasper Dr., Gilbert, AZ (US) 85296

( * ) Notice: Subject to any disclaimer, the term of this patent is extended or adjusted under 35 U.S.C. 154(b) by 0 days.

(21) Appl. No.: 10/058,940

(22) Filed: Jan. 28, 2002

Related U.S. Application Data

(60) Provisional application No. 60/322,841, filed on Sep. 17, 2001.

(51) Int. Cl.[7] .................................................. G01B 7/14
(52) U.S. Cl. ............................ 324/207.26; 324/207.13; 324/207.24; 335/78; 335/128
(58) Field of Search ................. 324/207.12, 207.13, 324/207.14, 207.2, 207.21, 207.22, 207.24, 207.26, 260, 261; 335/78, 128, 180–181; 361/160, 170, 179; 200/181

(56) References Cited

U.S. PATENT DOCUMENTS 4,503,922 A * 3/1985 Brosh et al. ......... 177/210 EM
6,483,056 B2 * 11/2002 Hyman et al. ............... 200/181
6,492,887 B1 * 12/2002 Diem et al. .................... 335/78
2002/0050880 A1 * 5/2002 Ruan et al. .................... 335/78
2002/0050881 A1 * 5/2002 Hyman et al. ................. 335/78

* cited by examiner

*Primary Examiner*—Jay Patidar
(74) *Attorney, Agent, or Firm*—Parsons & Goltry; Robert A. Parsons; Michael W. Goltry

(57) ABSTRACT

Micro magnetic position sensor apparatus includes a magnet for producing a magnetic field, a fixed contact, and a cantilever having magnetic material positioned therein to produce a torque on the cantilever in the magnetic field, the torque tending to align the cantilever with magnetic field lines in the magnetic field. The cantilever is mounted to provide it with a first position in electrical connection with the fixed contact and a second position in electrical disconnect with the fixed contact. The cantilever is further mounted so as to be normally in one of the first and second positions and movable to the other of the first and second positions when the magnetic field lines in the magnetic field are altered relative to the cantilever by proximity of an external object.

20 Claims, 8 Drawing Sheets

120
FIG. 13
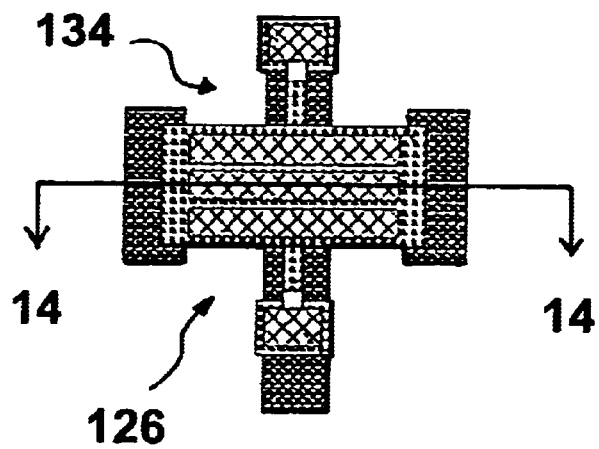
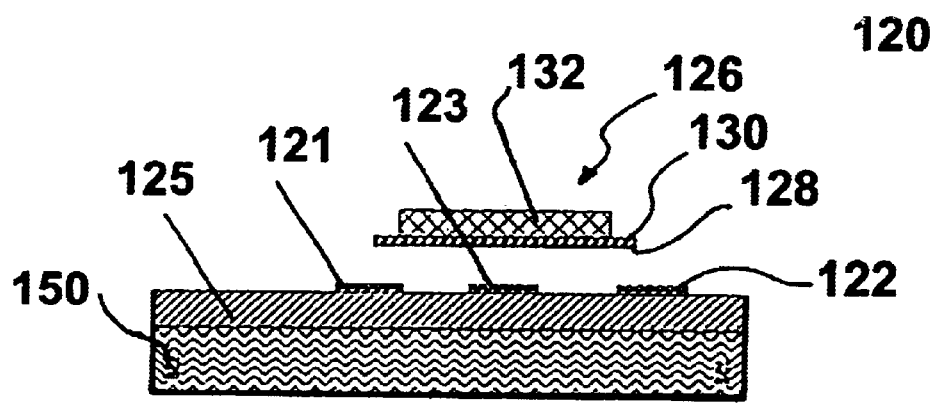
FIG. 14

MICRO MAGNETIC PROXIMITY SENSOR APPARATUS AND SENSING METHOD

CROSS-REFERENCE TO RELATED APPLICATION

This application claims the benefit of U.S. Provisional Application Ser. No. 60/322,841, entitled MICRO MAGNETIC SWITCH FABRICATION AND APPARATUS, filed Sep. 17, 2001.

FIELD OF THE INVENTION

This invention relates to magnetic proximity sensors and methods of using the proximity sensors for sensing proximity of external objects.

More particularly, the present invention relates to very small magnetic proximity sensors capable of sensing small distances and various applications and uses of the sensors.

BACKGROUND OF THE INVENTION

Recently, novel latching micro magnetic relays were discovered. The novel latching micro magnetic relay is based on preferential magnetization of a soft magnetic cantilever in a permanent external magnetic field. Switching between two magnetic states is accomplished by momentarily changing the direction of the cantilever's. magnetization by passing a short current pulse through a planar coil situated adjacent the cantilever. Once the relay is switched, it is held in this nonvolatile state (latched) by the permanent external magnetic field. Additional information as to the construction and operation of the novel latching micro magnetic relay is disclosed in a co-pending U.S. patent application entitled "Electronically Switching Latching Micro-Magnetic Relay and Method of Operating Same", with Ser. No. 09/496,446, filing date Feb. 2, 2000, and incorporated herein by reference.

In the prior art, proximity sensors are generally relatively large devices that include circuitry for sensing a change in a magnetic or electric field. In most applications these proximity sensors were designed for stationary use and were not portable or movable. A portable application has been designed, and discussed in the literature, using a Microreed, which resulted in an ultra-small passive MEMS magnetic portable proximity sensor. However, the Microreed sensor is not sufficiently versatile to provide a proximity sensor usable in a variety of different applications.

It would be highly advantageous, therefore, to remedy the foregoing and other deficiencies inherent in the prior art.

Accordingly, it is an object the present invention to provide new and improved micro magnetic proximity sensor apparatus and methods of use.

Another object of the present invention is to provide new and improved micro magnetic proximity sensor apparatus that is highly versatile and can be used in a variety of applications with only slight modifications.

And another object of the present invention is to provide new and improved micro magnetic proximity sensor apparatus that is relatively easy to fabricate and use.

Still another object of the present invention is to provide new and improved micro magnetic proximity sensor apparatus capable of sensing very small or short distances.

Yet another object of the present invention is to provide new and improved micro magnetic proximity sensor apparatus that is capable of sensing direction of movement as well as proximity.

BRIEF DESCRIPTION OF THE DRAWINGS

The invention will become readily apparent to those skilled in the art from the following detailed description of preferred embodiments thereof, taken in conjunction with the drawings in which:

FIG. 13 is view in top plan of another embodiment of a micro magnetic proximity sensor in accordance with the present invention;

FIG. 14 is a sectional side view of the micro magnetic proximity sensor as seen from the line 14–14 in FIG. 13;

SUMMARY OF THE INVENTION

Briefly, to achieve the desired objects of the present invention in accordance with a preferred embodiment thereof, provided is micro magnetic position sensor apparatus including a magnet for producing a magnetic field, a fixed contact, and a cantilever having magnetic material positioned therein to produce a torque on the cantilever in the magnetic field. The magnet can be fixedly mounted adjacent the cantilever, it can be mounted as, or in addition to, the magnetic material positioned in the cantilever, or it can be movably mounted external to the micro magnetic position sensor apparatus.

The torque on the cantilever tends to align the cantilever with magnetic field lines in the magnetic field. The cantilever is mounted to provide it with a first position in electrical connection with the fixed contact and a second position in electrical disconnect with the fixed contact. The cantilever is further mounted so as to be normally in one of the first and second positions and movable to the other of the first and second positions when the magnetic field lines in the magnetic field are altered relative to the cantilever by proximity of an external object.

DETAILED DESCRIPTION OF THE PREFERRED EMBODIMENTS

Figure 1:
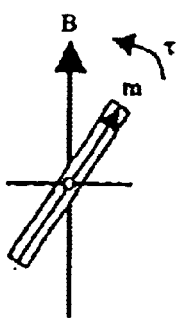
FIGS. 1, 2, and 3 are schematic views illustrating some basic principles in magnet operation.
Figure 2:
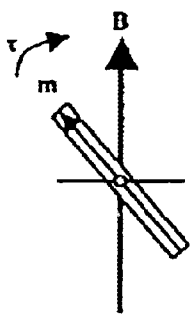

Turning now to the drawings, attention is directed to FIG. 1, which illustrates a soft magnetic object with a preferential magnetization axis (easy axis) that tends to align with an external magnetic field, illustrated as a single arrow with the designation (B). This is because the external magnetic field (B) induces a magnetization (m) along the easy axis such that a torque (τ=m×B) is produced that tends to minimize the total magnetic energy. For ease in understanding during further discussions, FIG. 1 illustrates counterclockwise torque and FIG. 2 illustrates clockwise torque.

Figure 3:
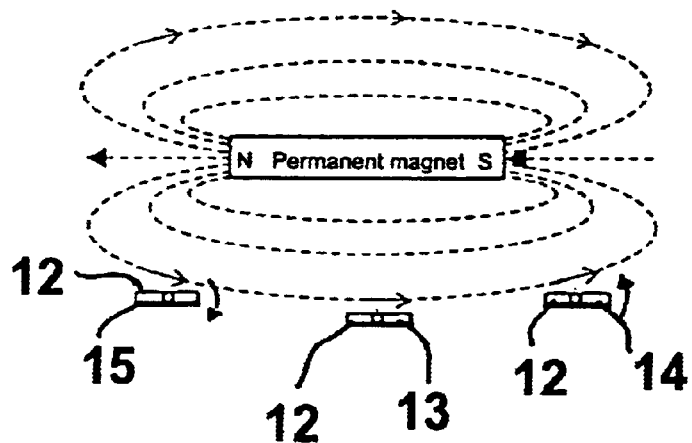

Referring additionally to FIG. 3, the location of a small magnetic object 12 in an external magnetic field produced by a permanent magnet 10 determines the magnetic torque on magnetic object 12. The elongated or rectangular shape of magnetic object 12, in this example, represents the easy axis. When magnetic object 12 is at position 13, there is no torque because the object's easy axis is already aligned with the local external magnetic field lines. At position 14, the external magnetic lines bend upwardly producing a counterclockwise torque on magnetic object 12 and at position 15 the external magnetic lines bend downwardly producing a clockwise torque on magnetic object 12.

Figure 4:
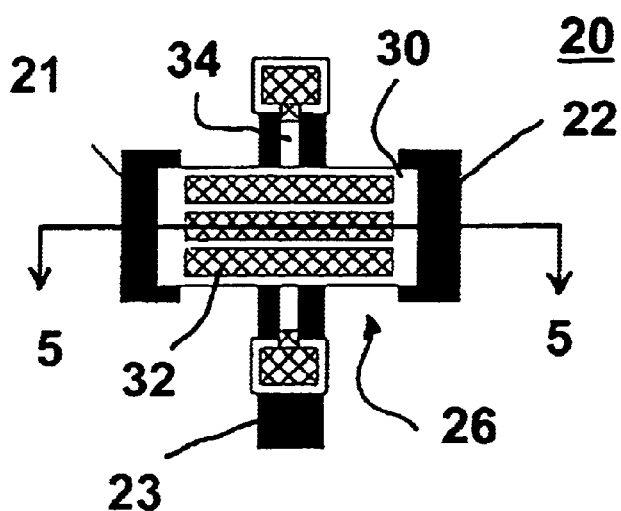
FIG. 4 is a top view of a micro magnetic proximity sensor in accordance with the present invention.
Figure 5:
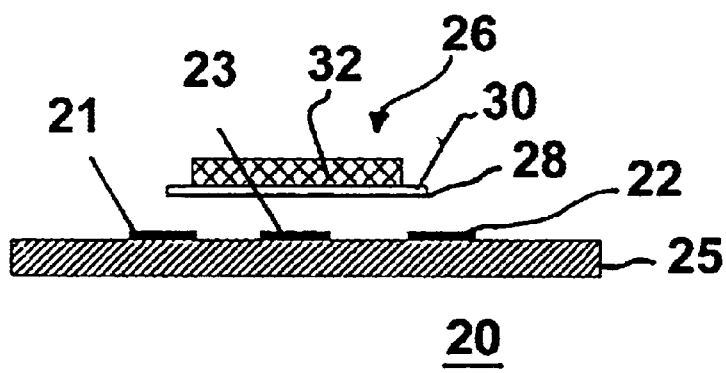
FIG. 5 is a sectional side view of the micro magnetic proximity sensor as seen from the line 5—5 in FIG. 4.

Turning now to FIGS. 4 and 5, a top plane and sectional view, respectively, are illustrated of one embodiment of a magnetic proximity sensor 20 in accordance with the present invention. Sensor 20 includes contact pads 21, 22, and 23 fabricated on a suitable (electrically insulating) substrate 25, a cantilever 26 has a lower conductor 28, a thin structural material 30, and thick soft magnetic materials 32. Lower conductor 28 is electrically connected to bottom conductor 23 through torsion springs 34. Cantilever 26 can rotate about torsion springs 34 under external influences (e.g. magnetic fields).. In some specific applications, that will be discussed in more detail presently, cantilever 26 can include a permanent magnet, rather than soft magnetic material, and the permanent magnet will align with magnetic fields in a fashion similar to the procedures described below.

Figure 6:
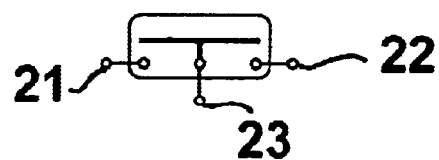
FIGS. 6, 7, and 8 are simplified schematic views of the micro magnetic proximity sensor illustrating three different possible states.
Figure 7:
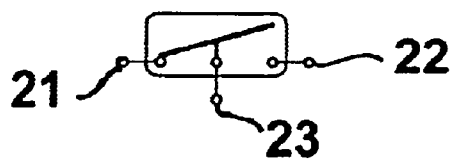
Figure 8:
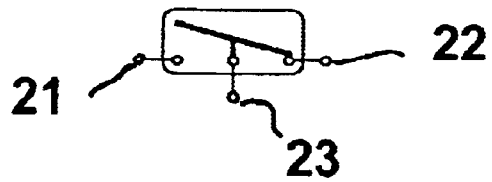

In the specific embodiment illustrated in FIGS. 4 and 5 cantilever 26 has three states (see schematic illustrations in FIGS. 6–8). A free standing state is illustrated schematically in FIG. 6. In this state, cantilever 26 is in a leveled position and bottom conductor 28 is not in contact with either of bottom contacts 21 or 22. A left-end-down state is illustrated in FIG. 7, wherein the left end of cantilever 26 is in contact with bottom contact 21 and forms a closed electrical path between bottom contacts 21 and 23. In this state the electrical path between bottom contacts 22 and 23 is open. The third state is a right-end-down state, wherein the right end of cantilever 26 is in contact with bottom contact 22 and forms a closed electrical path between bottom contacts 22 and 23. In this state the electrical path between bottom contacts 21 and 23 is open. As will be understood from this description, the flexibility (stiffness) of torsion springs 34 can be designed to have different magnetic sensitivity. Also, in some specific applications it may be desirable to anchor the cantilever at one end, rather than in the middle, in which case it will be limited to two states: in electrical connection with a fixed contact; and electrically disconnected from the fixed contact (see the above described co-pending application).

Figure 9:
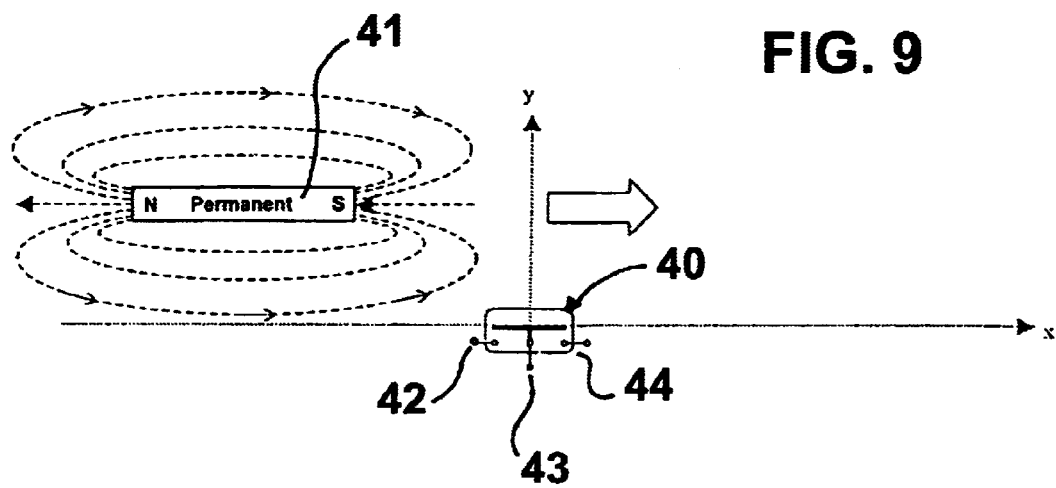
FIG. 9 is a schematic representation of a procedure illustrating the operation of a micro magnetic proximity sensor in accordance with the present invention.

Turning to FIG. 9, a procedure is illustrated schematically showing the operation of a micro magnetic proximity sensor 40 (which may, for example, be similar to magnetic sensor 20 of FIG. 4) in accordance with the present invention. In this embodiment, torsion springs supporting the cantilever are designed to have certain stiffness so that the cantilever is in the free-standing state (see FIG. 6) when the external magnetic field is absent. When a permanent magnet 41 is moved into proximity of sensor 40, the cantilever tends to align with the local magnetic field lines as explained above, producing various contact states. Therefore, the relative position of permanent magnet 41 can be detected by measuring the conductivities between terminals 42 and 43 and between terminals 43 and 44.

Figure 10:
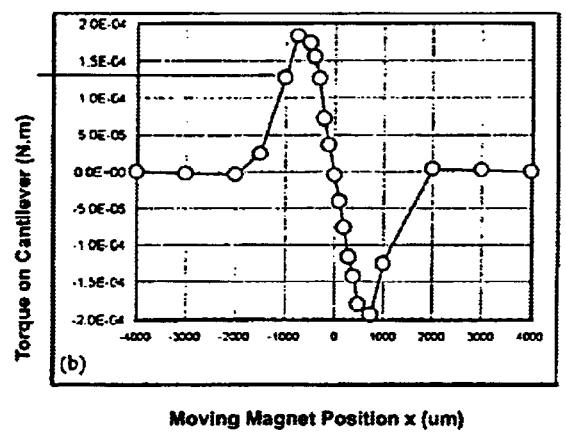
FIG. 10 is a graphical representation illustrating results obtained from the procedure illustrated in FIG. 9.

Referring additionally to FIG. 10, results are illustrated graphically of the effects of a magnetic field on the free-standing cantilever of sensor 40. The graphical representation of FIG. 10 illustrates the calculated torque on the cantilever as a function of the position x (where x is the horizontal axis in FIG. 9) of permanent magnet 41. In this procedure, the cantilever of sensor 40 is made of permalloy with a thickness equal to 20 um, a length equal to 400 um, and centered at x=0. The lower edge of permanent magnet 41 (NdFeB, north pole on the left end, thickness equal to 500 um and length equal to 1500 um) is 1000 um above the cantilever of sensor 40. The position x is measured from the center of permanent magnet 41 relative to the origin (x=0, y=0). As can be seen, the torque is positive (+z is pointing out from the paper) when x=−1000 um, electrically connecting terminals 42 and 43. Similarly, the torque is negative when x is approximately equal to 1000 um, electrically connecting terminals 43 and 44. In this case, it is assumed that the mechanical torque due to the torsion springs is smaller than the magnetic torque. For example, this case can be achieved by designing the magnitude of the mechanical torque to be 5e-5N-m, which is smaller than the magnitude of the magnetic torque for the range 200 um<|x|<1250 um.

The direction of relative movement of the permanent magnet and or the proximity sensor can be determined by sensing the sequential signals between terminals 41 and 43 and between terminals 42 and 43, hereinafter referred to as directional proximity sensing. Also, terminals 41 and 42 can be electrically connected as a single terminal to eliminate the directional effects, hereinafter referred to as unidirectional proximity sensing. Here it will be understood that permanent magnet 41 can be moved along the Y-axis for proximity sensing in either of these methods.

As can be seen from the graph of FIG. 10, there is a very small region around x=0 when the magnetic torque approaches zero (B field is horizontal). This property can be used to align two objects accurately by mounting permanent magnet 41 on one of the objects and sensor 40 on the other of the objects. The electrical signals from sensor 40 (between electrodes 41–43 and 42–43) can be used as a feedback mechanism to control the relative movement of the two objects until sensor 40 provides a zero signal, representing that x=0. The sensitivity can again be controlled by appropriately designing the torsion springs mounting the cantilever in sensor 40 and the strength and shape of magnet 41.

Figure 11:
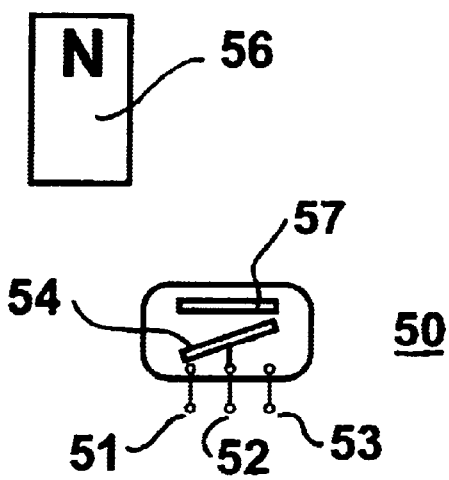
FIG. 11 is a schematic representation of a latching micro magnetic proximity sensor used in a procedure generally similar to that illustrated in FIG. 9.

Turning now to FIG. 11, a latching micro magnetic relay 50 is illustrated schematically with a permalloy cantilever 54, a left end terminal 51, a center or common terminal 52, and a right end terminal 53. For additional information on latching micro magnetic relays see the above described copending application. This proximity sensing operation includes a stationary permanent magnet 55 and a permanent magnet 56, which is moved along the X-axis. Here it will be understood that stationary magnet 55 could be the internal magnet of a latching micro magnetic relay, as disclosed in the above co-pending application, and the moving magnet is an external magnet. First, the magnetic field (B) distribution was calculated when x=−1000 um and cantilever 54 is rotated −2 degrees left and down (in the closed position illustrated). Second, the torque on cantilever 54 was calculated as a function of the position of permanent magnet 56 along the X-axis. In this operation, cantilever 54 is made of permalloy with a 20 um thickness and a 400 um length, centered at x=0 and with another permalloy layer 57 with high permeability ($\mu$), a 25 um thickness and a 800 um length, positioned 10 um below cantilever 54. Stationary permanent magnet 55 (NdFeB, north pole on the upper end, 500 um thickness and 1500 um length) is positioned 600 um below cantilever 54. Relay 50 is fabricated on an appropriate substrate with similar contacts and electrodes to those illustrated in FIG. 4.

This sensing operation produces two stable states (with either the left end of cantilever 54 down or the right end down) in cantilever 54 such that a memory mechanism is enabled. As an example, one process is described below, based on the above operation to show that latching micro magnetic relay 50 can memorize the moving direction of magnet 56. Moving magnet 56 (NdFeB, north pole on the upper end, with a 500 um thickness and a 1500 um length) is positioned 1000 um above cantilever 54. The position x is measured from the center of moving magnet 56 relative to the origin (x=0).

Figure 12:
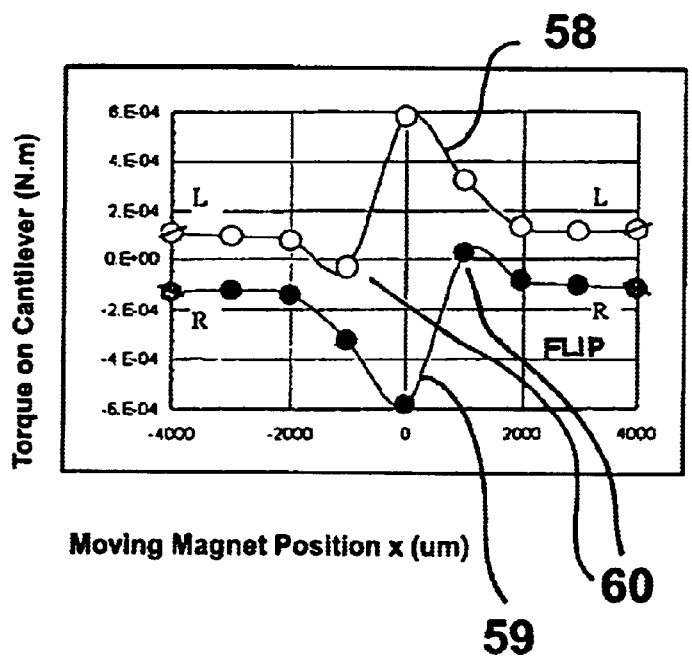
FIG. 12 is a graphical representation illustrating results obtained from the procedure illustrated in FIG. 9 using the latching micro magnetic proximity sensor of FIG. 11.

When moving magnet 56 is far away from cantilever 54 (e.g. $|x|>2000$ um), cantilever 54 can be in either of the two stable states (L state: left end down, or R state, right end down) and the magnetic torque produced by stationary magnet 55 keeps cantilever 54 in the original state. Assuming that cantilever 54 is initially in the L state, plot 58 of FIG. 12 illustrates the result of the movement of moving magnet 56. When moving magnet 56 is moved from x=4000 um to x=4000 um, cantilever 54 will flip from the L state to the R state at about x=−1000 um and then flip from the R state back to the L state at about x=1000 um. Assuming that cantilever 54 is originally in the R state, plot 59 of FIG. 12 illustrates the result of the movement of moving magnet 56. Cantilever 54 flips from the R state to the L state at about x=1000 um. In other words, cantilever 54 will always have a final L state when moving magnet 56 is moved from the far left in FIG. 11 to the far right, no matter what the initial state is. Similarly, cantilever 54 will always have a final R state when moving magnet 56 is moved from the far right to the far left. To illustrate this feature, plots 58 and 59 have "flip" points, designated 60, which illustrate that the torque on cantilever 54 changes from plot 58 to plot 59, or vice versa, (depending upon the initial state) as moving magnet 56 moves from left to right, or vice versa. In this operation the intermediate switching events can be used to detect the presence (proximity) of moving magnet 56.

Turning now to FIGS. 13 and 14, a top plane and sectional view, respectively, are illustrated of another embodiment of a magnetic proximity sensor 120 in accordance with the present invention. Sensor 120 includes contact pads 121, 122, and 123 fabricated on a suitable (electrically insulating) substrate 125, a cantilever 126 has a lower conductor 128, a thin structural material 130, and thick soft magnetic material 132. Lower conductor 128 is electrically connected to bottom conductor 123 through torsion springs 134. Cantilever 126 can rotate about torsion springs 134 under external influences (e.g. magnetic fields).

Also magnetic proximity sensor 120 has a permanent magnet 150, with a lateral north-south orientation, attached to the underside of substrate 125. It will be understood that permanent magnet 150 could be placed on top of cantilever 126 or in several other positions to provide the functions to be described.

In the specific embodiment illustrated in FIGS. 13 and 14, cantilever 126 has two states: a right-end-down state, wherein the right end of cantilever 126 is in contact with bottom contact 122 and forms a closed electrical path between bottom contacts 122 and 123; and a left-end-down state, wherein the left end of cantilever 126 is in contact with bottom contact 121 and forms a closed electrical path between bottom contacts 121 and 123. As will be understood from this description, the flexibility (stiffness) of torsion springs 134 can be designed to have different magnetic sensitivity. In this specific embodiment, the normal or at-rest position of magnetic proximity sensor 120 is the right-end-down state but it should be understood that the left-end-down state could be normal or the sensor could be designed to have three states, in which case any of the three states could be the normal or at-rest position.

Figure 15:
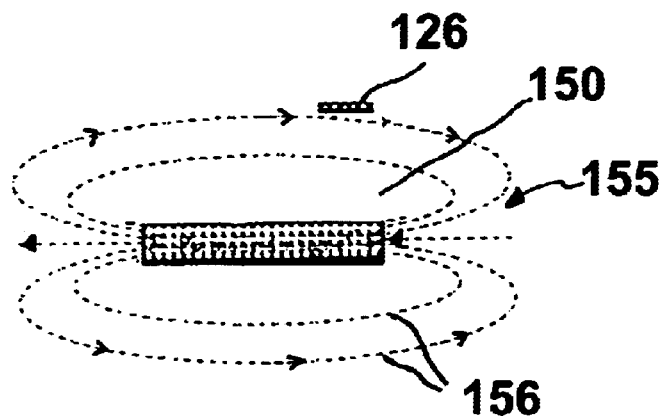
FIG. 15 is a schematic representation of the latching micro magnetic proximity sensor illustrated in FIG. 13 with no magnetic bodies in proximity.

Referring additionally to FIG. 15, a schematic representation of micro magnetic proximity sensor 120 is illustrated with no magnetic bodies in proximity. In this schematic representation, permanent magnet 150 is illustrated generating a magnetic field 155 with magnetic field lines 156. As is understood in the art, magnetic field lines 156 are closed lines that extend from one end of permanent magnet 150 to the other end. Because of the closed configuration, magnetic field lines 156 are arcuate in most areas and create a torque on cantilever 126 tending to move cantilever 126 into alignment with magnetic field lines 156. As an example, in FIG. 15 cantilever 126 is positioned in a horizontal orientation with magnetic field lines 156 arcing downwardly to create a clockwise torque on cantilever 126. The clockwise torque on cantilever 126 holds cantilever 126 normally in the right-end-down state, wherein the right end of cantilever 126 is in contact with bottom contact 122 and forms a closed electrical path between bottom contacts 122 and 123, as described above.

Figure 16:
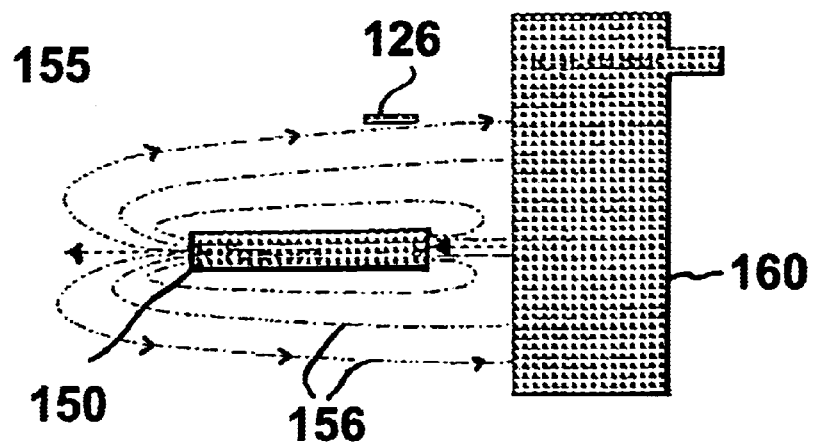
FIG. 16 is a schematic representation of the latching micro magnetic proximity sensor illustrated in FIG. 13 with a magnetic body in proximity.

Referring additionally to FIG. 16, a schematic representation of micro magnetic proximity sensor 120 is illustrated with an external magnetic body 160 in proximity. The proximate position of external magnetic body 160 causes magnetic field lines 156 to arc upwardly adjacent to cantilever 126. Upwardly arcing field lines 156 create a counterclockwise torque on cantilever 126. The counterclockwise torque on cantilever 126 moves cantilever 126 from the right-end-down state to the left-end-down state. Thus, the left end of cantilever 126 is in contact with bottom contact 121 and forms a closed electrical path between bottom contacts 121 and 123. It will be understood that magnetic body 160 can include magnetic material, e.g., nickel, iron, magnesium, etc. or it can include a magnet or partially or lightly magnetized material.

In a specific example of a micro magnetic proximity sensor similar to sensor 120, results were tabulated as a function of the distance x of the external magnetic body 160 from cantilever 126. In this example the torque was negative (clockwise) when the distance x was larger than approximately 1000 $\mu$m so that the cantilever stayed in the right-end-down state. The torque became positive (counterclockwise) when x was less than approximately 1000 $\mu$m and the cantilever flipped to the left-end-down state. In the open or normal state the cantilever is rotated approximately 2 degrees clockwise from a level position and in the closed state the cantilever is rotated approximately 2 degrees counterclockwise from the level position. It should be noted that the sign and magnitude of the torque depend weakly on the small (2 degrees) rotation angle, and the cantilever will stay in the respective state once flipped.

Many different embodiments or circuit configurations can be devised to incorporate the proximity sensor operations described above. Also, a transistor (e.g. bipolar, MOSFET, etc.) and a resistor can be connected to the proximity sensor to increase the proximity sensor's load-ability. Examples of some specific circuit configurations are illustrated in FIGS. 17, 18, and 19.

Figure 17:
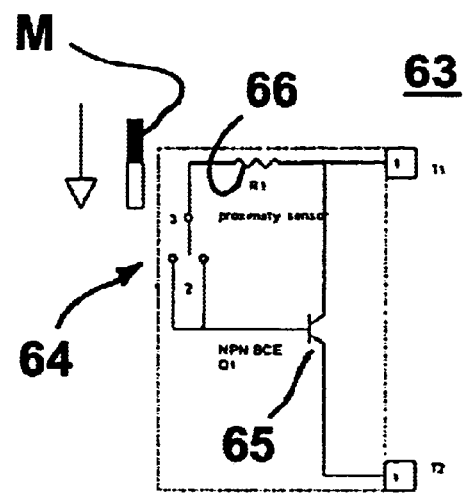
FIGS. 17–21 are schematic diagrams illustrating different configurations for the proximity sensor application in accordance with the present invention.

Illustrated in FIG. 17 is an example of a normally open sensor circuit 63 using a proximity sensor 64 and an NPN transistor 65. In this example, the gate of transistor 65 is connected directly to both fixed contacts of proximity sensor 64 (e.g. contacts 21 and 22 of sensor 20 in FIG. 4). The emitter and collector of transistor 65 are connected directly to two output terminals of sensor circuit 63. The movable contact of proximity sensor 64 (e.g. contact 23 of sensor 20 in FIG. 4) is connected through a bias resistor 66 to the collector of transistor 65. An object M is illustrated adjacent to proximity sensor 64, which in this embodiment is an external movable-magnet but, as will be explained presently, could simply be magnetic material such as iron, nickel, etc.

Thus, when object M is not in proximity to proximity sensor 64, the circuit between the collector and the gate of transistor 65 is open and transistor 65 is non-conducting or off. This results in the circuit between the two output terminals being open. When object M comes into proximity with proximity sensor 64, the movable contact is moved into contact with either or both of the fixed contacts and a circuit is completed between the collector and gate of transistor 65. This completed circuit biases transistor 65 into conduction so that a circuit is completed between the two output terminals of sensor circuit 63. It should be understood that proximity sensor 64 could be the latching type that remains closed once object M is sensed or the type that only remains closed when object M is in the proximity, depending upon the specific application.

Figure 18:
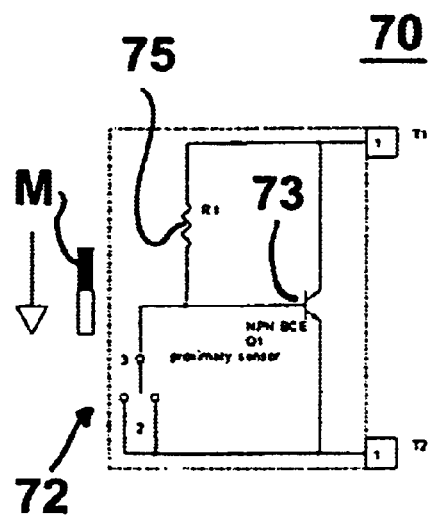
Figure 19:
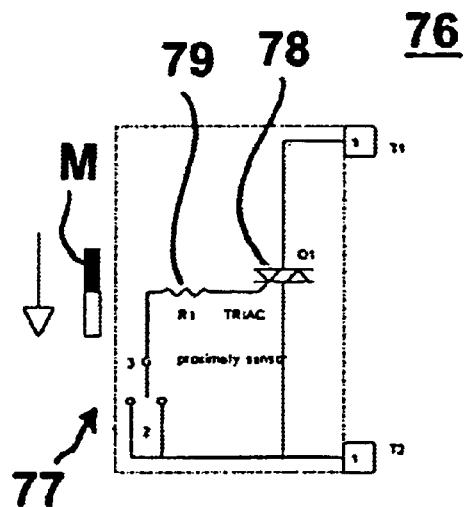

Illustrated in FIG. 18 is an example of a normally closed proximity circuit 70 using a proximity sensor 72 and an NPN transistor 73. In this example, the gate of transistor 73 is connected directly to the movable contact of proximity sensor 64 (e.g. contact 23 of sensor 20 in FIG. 4) and through a bias resistor 75 to the collector. The collector is also connected directly to a first output terminal of proximity circuit 70. The two fixed contacts of proximity sensor 72 (e.g. contacts 21 and 22 of sensor 20 in FIG. 4) are connected directly to the emitter and a second output terminal of proximity circuit 70. An object M is illustrated adjacent to proximity sensor 72, which in this embodiment is an external movable magnet but, as will be explained presently, could simply be magnetic material such as iron, nickel, etc.

Thus, the circuit between the collector and the gate of transistor 73 is completed through resistor 75 and the circuit between the gate and the emitter is normally open when object M is not in proximity to proximity sensor 70. In this scenario, transistor 73 conducts current between the two output terminals. When object M comes into proximity with proximity sensor 64, the movable contact is moved into contact with either or both fixed contacts and a circuit is completed between the gate and emitter of transistor 70. This completed circuit ties the gate potential to the emitter potential, turning off transistor 70, and resulting in the circuit between the two output terminals being open. It should be understood that proximity sensor 72 could be the latching type that remains closed once object M is sensed or the type that only remains closed when object M is in the proximity, depending upon the specific application.

Turning now to FIG. 19, a normally open AC proximity circuit 76 is illustrated using a proximity sensor 77 and a triac 78. The two output terminals of triac 78 are connected as two output terminals of AC proximity circuit 76. The gate of triac 78 is connected through a bias resistor 79 to the movable contact of proximity sensor 77. The two fixed contacts of proximity sensor 77 are connected directly to one of the output terminals. An object M is illustrated adjacent to proximity sensor 77, which in this embodiment is an external movable magnet but, as will be explained presently, could simply be magnetic material such as iron, nickel, etc. As is understood by those skilled in the art, a triac provides an open circuit between the two output terminals until sufficient current is supplied to the gate to cause the triac to conduct. Once the triac conducts (turns on) it remains conducting until the current to the gate is starved or reduced to a turn-off point. Also, the triac is capable of conducting alternating current (AC) between the two output terminals. Again, it should be understood that proximity sensor 77 could be the latching type that remains closed once object M is sensed or the type that only remains closed when object M is in the proximity, depending upon the specific application.

Figure 20:
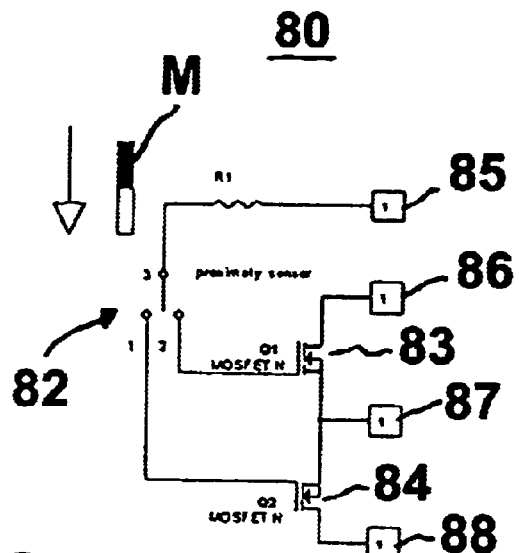

It will be understood that all of the circuits described in conjunction with FIGS. 17–19 are designed for unidirectional proximity sensing, since both fixed contacts of the proximity sensors are connected together. Turning now to FIG. 20, a schematic diagram of a directional proximity circuit 80 is illustrated which utilizes the unique characteristics of the novel proximity sensor to provide directional proximity sensing. In this example, proximity circuit 80 includes a proximity sensor 82 and two MOSFET type devices 83 and 84. It will of course be understood that other types of transistors could be utilized and MOSFETs are disclosed as a preferred embodiment only for their manufacturing convenience and low current requirements. An object M is illustrated adjacent to proximity sensor 82, which in this embodiment is an external movable magnet but, as will be explained presently, could simply be magnetic material such as iron, nickel, etc.

The movable contact of proximity sensor 82 is connected through a bias resistor to an output terminal 85. A first fixed contact of proximity sensor 82 is connected to the gate of MOSFET 83. The collector of MOSFET 83 is connected directly to output terminal 86 and the emitter of MOSFET 83 is connected directly to output terminal 87. A second fixed contact of proximity sensor 82 is connected to the gate of MOSFET 84. The emitter of MOSFET 84 is connected directly to output terminal 87 and the collector of MOSFET 84 is connected directly to output terminal 88. It will of course be understood that the discussion of collectors and emitters of MOSFET type transistors is generally only for convenience since the actual transistor can be connected in a variety of configurations, depending upon the application and following circuitry.

In the operation of directional proximity circuit 80, the direction of movement of external object M can easily be determined, depending upon the sequence of the sensor's terminal state. Assuming terminal 85 is connected to a positive supply and terminal 87 is connected to ground, when the impedance of terminal 86 changes before the impedance of terminal 88 does, it indicates that the direction of movement of object M is downward. When the impedance of terminal 88 changes before the impedance of terminal 86 does, it indicates that the direction of movement of object M is upward.

Figure 21:
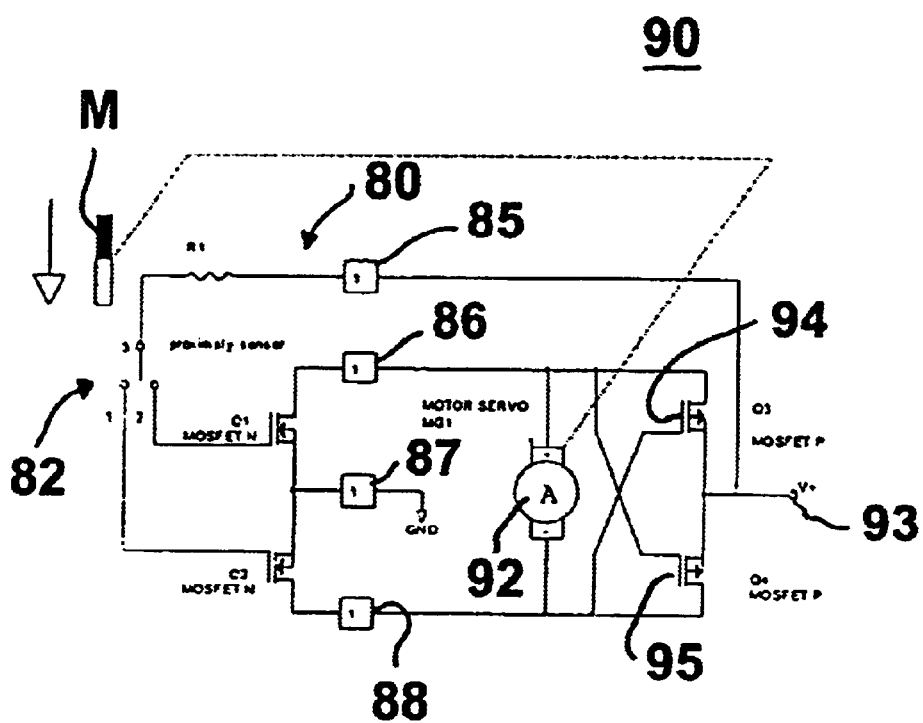

Turning now to FIG. 21, a zeroing or alignment circuit 90 is illustrated in which a directional proximity sensor (e.g. the directional proximity sensor 80 of FIG. 20) is used. In circuit 90, a servomotor 92 is connected between output terminals 86 and 88. Terminal 87 is grounded and terminal 85 is connected to a terminal 93, which is adapted to be connected to a positive voltage supply. Positive voltage supply terminal 93 is also connected to the emitters of a pair of MOSFETs 94 and 95. The collector of MOSFET 94 is connected to output terminal 86 and the collector of MOSFET 95 is connected to output terminal 88. The gate of MOSFET 94 is connected to output terminal 88 and the gate of MOSFET 95 is connected to output terminal 86. Also, external movable magnet M is mechanically coupled to servomotor 92.

In alignment circuit 90, information of the state of proximity sensor 82 is fed back to control servomotor 92 to move external magnet M until it is substantially perfectly aligned or positioned relative to proximity sensor 82. Other modifications and embodiments can be devised by altering or adding circuitry.

Various changes and modifications to the embodiments herein chosen for purposes of illustration will readily occur to those skilled in the art. To the extent that such modifications and variations do not depart from the spirit of the invention, they are intended to be included within the scope thereof, which is assessed only by a fair interpretation of the following claims.

Having fully described the invention in such clear and concise terms as to enable those skilled in the art to understand and practice the same, the invention claimed is:

1. Micro magnetic position sensor apparatus comprising:
    a magnet generating a magnetic field with magnetic field lines;
    a mounting substrate;
    a first fixed contact mounted on the substrate;
    a cantilever including magnetic material positioned in the cantilever to produce a torque on the cantilever in the magnetic field, the torque tending to align the cantilever with magnetic field lines in the magnetic field; and
    the cantilever being mounted on the substrate so as to provide the cantilever with a first position in electrical connection with the fixed contact and a second position in electrical disconnect with the fixed contact, the cantilever further being mounted so as to be normally in one of the first and second positions and movable to an other of the first and second positions when the magnetic field lines in the magnetic field are altered relative to the cantilever to produce the torque on the cantilever tending to move the cantilever to the other of the first and second positions.

2. Micro magnetic position sensor apparatus as claimed in claim 1 wherein the magnet is movably mounted external to the substrate and movement of the magnet relative to the cantilever alters the magnetic field lines of the magnetic field relative to the cantilever.

3. Micro magnetic position sensor apparatus as claimed in claim 1 wherein the magnet is coupled to the substrate to produce a constant magnetic field on the cantilever and the magnetic field lines of the magnetic field are altered relative to the cantilever by an object including magnetic material in proximity to the cantilever.

4. Micro magnetic position sensor apparatus as claimed in claim 3 wherein the cantilever and magnet are further mounted to latch the cantilever when the cantilever moves to the other of the first and second positions.

5. Micro magnetic position sensor apparatus as claimed in claim 1 further including second and third fixed contacts mounted on the substrate, and the cantilever mounted on the substrate being provided with a third position in electrical connection with the second fixed contact, a fourth position in electrical disconnect with the second and third fixed contacts, and a fifth position in electrical connection with the third fixed contact.

6. Micro magnetic position sensor apparatus as claimed in claim 5 wherein the magnet is movably mounted external to the substrate for movement between sixth, seventh and eighth positions relative to the cantilever and movement of the magnet relative to the cantilever alters the magnetic field lines of the magnetic field relative to the cantilever, the cantilever being torqued to the sixth position when the magnet is moved to the sixth position, to the seventh position when the magnet is moved to the seventh position, and to the eighth position when the magnet is moved to the eighth position.

7. Micro magnetic position sensor apparatus as claimed in claim 6 further including circuitry attached to the second and third fixed contacts and the cantilever for providing a signal indicative of a direction of movement of the magnet between the sixth, seventh, and eighth positions.

8. Micro magnetic position sensor apparatus comprising:
    a mounting substrate;
    a magnet generating a magnetic field with magnetic field lines fixed adjacent the substrate;
    a fixed contact mounted on the substrate;
    a cantilever including magnetic material positioned in the cantilever to produce a torque on the cantilever in the magnetic field, the torque tending to align the cantilever with magnetic field lines in the magnetic field; and
    the cantilever being mounted on the substrate so as to provide the cantilever with a first position in electrical connection with the fixed contact and a second position in electrical disconnect with the fixed contact, the cantilever further being mounted in the magnetic field so as to be normally in the second position and movable to the first position when the magnetic field lines in the magnetic field are altered relative to the cantilever to produce the torque on the cantilever tending to move the cantilever to the first position.

9. Micro magnetic position sensor apparatus as claimed in claim 8 wherein the cantilever and magnet are further mounted to latch the cantilever when the cantilever moves to the first position.

10. Micro magnetic position sensor apparatus comprising:
    a magnet generating a magnetic field with magnetic field lines;
    a mounting substrate;
    first and second fixed contacts mounted on the substrate;
    a cantilever including magnetic material positioned in the cantilever to produce a torque on the cantilever in the magnetic field, the torque tending to align the cantilever with magnetic field lines in the magnetic field; and
    the cantilever being mounted on the substrate to provide the cantilever with a first position in electrical connection with the first fixed contact, a second position in electrical disconnect with the first and second fixed contacts, and a third position in electrical connection with the second fixed contact, the cantilever further being mounted so as to be normally in the second position and movable to one of the first and third positions; and
    a magnet movably mounted external and adjacent to the substrate for movement between first, second and third positions relative to the cantilever and movement of the magnet relative to the cantilever alters the magnetic field lines of the magnetic field relative to the cantilever, the cantilever being torqued to the first position when the magnet is moved to the first position, to the second position when the magnet is moved to the second position, and to the third position when the magnet is moved to the third position.

11. Micro magnetic position sensor apparatus as claimed in claim 10 further including circuitry attached to the first and second fixed contacts and the cantilever for providing a signal indicative of a direction of movement of the magnet between the first, second, and third positions.

12. A method of sensing proximity of an external object with micro magnetic position sensor apparatus, the method comprising the steps of:

provided micro magnetic position sensor apparatus including a fixed contact and a pivotally mounted cantilever contact, the cantilever contact including magnetic material positioned in the cantilever contact to produce a torque on the cantilever contact in a magnetic field, the torque tending to align the cantilever contact with magnetic field lines in the magnetic field, and the cantilever contact being mounted to provide the cantilever contact with a first position in electrical connection with the fixed contact and a second position in electrical disconnect with the fixed contact; and positioning a magnet adjacent the cantilever contact, the magnet generating a magnetic field with magnetic field lines encompassing the cantilever contact, when the magnetic field lines in the magnetic field are altered relative to the cantilever contact by proximity of an object to the cantilever contact a torque is produced on the cantilever contact tending to move the cantilever contact to one of the first and second positions.

13. A method as claimed in claim 12 wherein the step of positioning the magnet includes positioning the magnet as a portion of the cantilever contact.

14. A method as claimed in claim 12 wherein the step of positioning the magnet includes positioning the magnet in a fixed position relative to the cantilever contact.

15. A method as claimed in claim 14 wherein the step of positioning the magnet includes positioning the magnet to produce a constant magnetic field on the cantilever contact and the magnetic field lines of the magnetic field are altered relative to the cantilever contact by an object including magnetic material in proximity to the cantilever contact.

16. A method as claimed in claim 14 wherein the step of fixedly positioning the magnet includes positioning the cantilever contact in the magnetic field so as to be normally in the second position and movable to the first position when the magnetic field lines in the magnetic field are altered relative to the cantilever contact to produce a torque on the cantilever contact tending to move the cantilever contact to the first position.

17. A method as claimed in claim 12 wherein the step of positioning the magnet includes positioning the magnet external to the micro magnetic position sensor apparatus and movable relative to the cantilever contact.

18. A method as claimed in claim 17 wherein the step of positioning the magnet movable relative to the cantilever contact includes positioning the magnet so that movement of the magnet relative to the cantilever alters the magnetic field lines of the magnetic field relative to the cantilever.

19. A method as claimed in claim 18 wherein the step of providing micro magnetic position sensor apparatus includes providing first and second fixed contacts and a pivotally mounted cantilever contact and providing the cantilever contact with a first position in electrical connection with the first fixed contact, a second position in electrical disconnect with the first and second fixed contacts, and a third position in electrical connection with the second fixed contact, and the step of positioning the magnet includes movably mounting the magnet external and adjacent to the micro magnetic position sensor apparatus for movement between first, second and third positions relative to the cantilever contact and movement of the magnet relative to the cantilever contact alters the magnetic field lines of the magnetic field relative to the cantilever contact, the cantilever contact being torqued to the first position when the magnet is moved to the first position, to the second position when the magnet is moved to the second position, and to the third position when the magnet is moved to the third position.

20. A method as claimed in claim 19 further including a step: of providing circuitry and attaching the circuitry to the first and second fixed contacts and the cantilever for providing a signal indicative of a direction of movement of the magnet between the first, second, and third positions.

* * * * *